(12) United States Patent
Wang

(10) Patent No.: US 9,391,649 B2
(45) Date of Patent: Jul. 12, 2016

(54) ENVELOPE SHAPING IN ENVELOPE TRACKING POWER AMPLIFICATION

(71) Applicant: Microsoft Corporation, Redmond, WA (US)

(72) Inventor: Zhancang Wang, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/543,770

(22) Filed: Nov. 17, 2014

(65) Prior Publication Data

US 2016/0142078 A1    May 19, 2016

(30) Foreign Application Priority Data

Nov. 17, 2014   (CN) .......................... 2014 1 0650453

(51) Int. Cl.
| | | |
|---|---|---|
| *H04K 1/02* | (2006.01) | |
| *H04L 25/03* | (2006.01) | |
| *H04L 25/49* | (2006.01) | |
| *H04B 1/04* | (2006.01) | |
| *H04L 27/26* | (2006.01) | |
| *H04L 27/00* | (2006.01) | |

(52) U.S. Cl.
CPC .............. *H04B 1/04* (2013.01); *H04L 27/0008* (2013.01); *H04L 27/2615* (2013.01); *H04B 2001/0408* (2013.01)

(58) Field of Classification Search
CPC ............ H04B 1/04; H04B 2001/0408; H04B 2001/0425; H04L 27/2615; H04L 27/0008
USPC .................................................. 375/296, 297
See application file for complete search history.

(56) References Cited

U.S. PATENT DOCUMENTS

| 7,440,733 B2 | 10/2008 | Maslennikov et al. |
| 8,159,295 B2 | 4/2012 | Asbeck et al. |

(Continued)

FOREIGN PATENT DOCUMENTS

WO    2013144277 A1    10/2013

OTHER PUBLICATIONS

"Envelope Tracking and Digital Pre-Distortion Test Solution for RF Amplifiers", Sep. 23, 2014 Available at: schwarz.com/pws/dl_downloads/dl_application/application_notes/1gp104/1GP104_1E_ET_DPD_testing_for_amplifiers.pdf.

(Continued)

*Primary Examiner* — Phuong Phu
(74) *Attorney, Agent, or Firm* — Judy Yee; Micky Minhas; Zete Law, P.L.L.C.

(57) ABSTRACT

The subject matter described herein relates to envelope shaping in envelope tracking power amplification. A method, apparatus and computer storage medium are provided for envelope shaping in envelope tracking power amplification. In an embodiment, the method comprises performing an envelope shaping operation on reference envelope signals in a time domain to obtain shaped envelope signals; performing a signal quality control on the shaped envelope signals in a frequency domain; and converting the shaped envelope signals from the frequency domain into the time domain to obtain resulting shaped envelope signals. In such a way, a better signal quality can be provided without any modifications to the receiver side. And in turn, the PAPR of the envelope signal may be reduced before entering into a supply modulator and the efficiency of the ET supply modulator could be improved. As a result, the ET PA system performance can be enhanced.

20 Claims, 6 Drawing Sheets

(56) References Cited

U.S. PATENT DOCUMENTS

| | | |
|---|---|---|
| 8,457,246 B2 | 6/2013 | Kim et al. |
| 8,718,188 B2 | 5/2014 | Balteanu et al. |
| 2007/0281635 A1 | 12/2007 | McCallister et al. |
| 2013/0093511 A1 | 4/2013 | Baek et al. |
| 2013/0187711 A1 | 7/2013 | Goedken et al. |
| 2014/0018133 A1 | 1/2014 | Winiecki |
| 2014/0028370 A1 | 1/2014 | Wimpenny |
| 2014/0028392 A1 | 1/2014 | Wimpenny |
| 2014/0073273 A1 | 3/2014 | Asensio et al. |
| 2014/0177677 A1* | 6/2014 | Luo et al. .................. 375/131 |
| 2014/0187182 A1 | 7/2014 | Yan et al. |
| 2014/0199949 A1 | 7/2014 | Nagode et al. |
| 2015/0155836 A1* | 6/2015 | Midya et al. ......... H03F 1/3247 |

OTHER PUBLICATIONS

Kim, et al., "Efficiently Amplified", In IEEE Microwave Magazine, vol. 11, Issue 5, Aug. 2010, 14 pages.

Sperlich, et al., "Designing a High-Efficiency WCDMA BTS Using TI GC5322 Digital Pre-Distortion Processor", In Application Report SLWA060, Jun. 2010, 26 pages.

Tafuri, et al., "Efficiency Enhancement of an Envelope Tracking Power Amplifier Combining Supply Shaping and Dynamic Biasing", In Proceedings of 8th European Microwave Integrated Circuits Conference, Oct. 6, 2013, pp. 520-523.

Wu, et al., "High-Efficiency Silicon-Based Envelope-Tracking Power Amplifier Design with Envelope Shaping for Broadband Wireless Applications", In IEEE Journal of Solid-State Circuits, vol. 48, Issue 9, Sep. 2013, pp. 2030-2040.

Zhao, Chunming, "Distortion-Based Crest Factor Reduction Algorithms in Multi-Carrier Transmission Systems", In Doctoral Dissertation, Dec. 2007, 118 pages.

Wang, et al., "Design of Wide-Bandwidth Envelope-Tracking Power Amplifiers for OFDM applications", In IEEE Transactions on Microwave Theory and Techniques, vol. 53, Issue 4, Apr. 2005, 12 pages.

Hassan, et al., "A Wideband CMOS/GaAs HBT envelope Tracking Power Amplifier for 4G LTE Mobile Terminal Applications", In IEEE Transactions on Microwave Theory and Techniques, vol. 60, Issue 5, May 2012, 10 pages.

Choi, et al., "A Polar Transmitter with CMOS Programmable Hysteretic-Controlled Hybrid Switching Supply Modulator for Multistandard Applications", In IEEE Transactions on Microwave Theory and Techniques, vol. 57, Issue 7, Jul. 2009, 12 pages.

Kim, et al., "Optimization for Envelope Shaped Operation of Envelope Tracking Power Amplifier", In IEEE Transactions on Microwave Theory and Techniques, vol. 59, Issue 7, Jul. 2011, 9 pages.

Jeong, et al., "Wideband Envelope Tracking Power Amplifier With Reduced Bandwidth Power Supply Waveform", In IEEE MTT-S International Microwave Symposium Digest, Jun. 7, 2009, 4 pages.

* cited by examiner

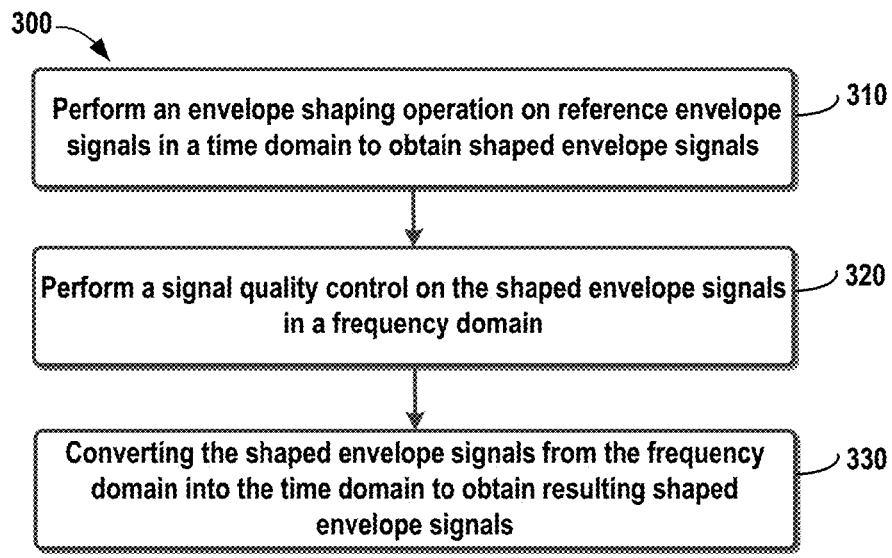
FIG. 3
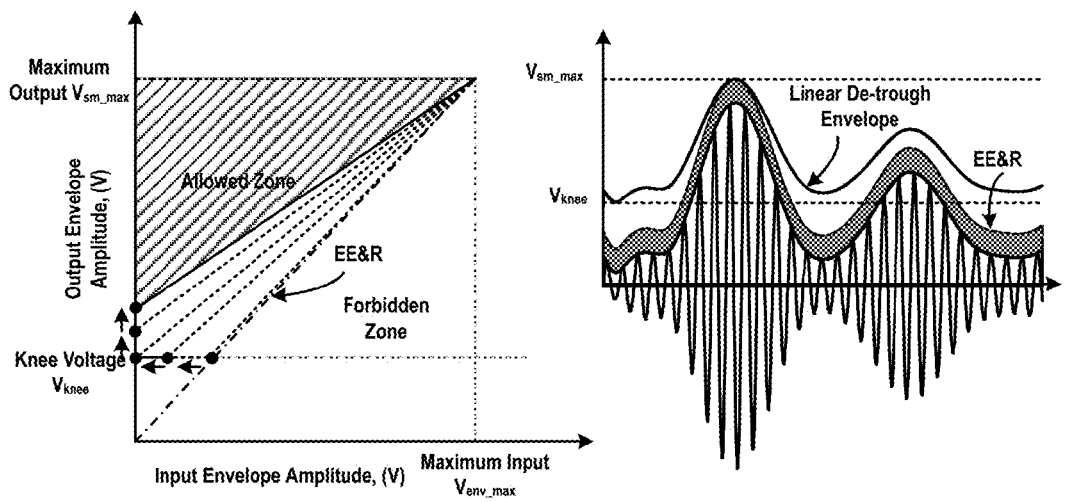
FIG. 4A
FIG. 4B

ENVELOPE SHAPING IN ENVELOPE TRACKING POWER AMPLIFICATION

RELATED APPLICATIONS

This application claims priority to Chinese Application No. 201410650453.9, filed on Nov. 17, 2014, and entitled "ENVELOPE SHAPING IN ENVELOPE TRACKING POWER AMPLIFICATION." This application claims the benefit of the above-identified application, and the disclosure of the above-identified application is hereby incorporated by reference in its entirety as if set forth herein in full.

BACKGROUND

The efficiency of a Radio Frequency (RF) Power Amplifier (PA) is generally defined as a ratio between a desirable transmitted radio power and a total power from a power supply. However, this ratio appears to be rather low in emerging wideband applications and beyond if traditional architectures are still employed. For a purpose of enhancing the efficiency, an Envelope Tracking (ET) technique has been proposed and utilized in the wireless communication industry, particularly in user equipment and base stations. The ET technique refers to an approach to RF amplifier design, in which the power supply voltage applied to the power amplifier is continuously adjusted to ensure that the amplifier is operating at peak efficiency for power required at each instant of transmission. Moreover, the ET technique has been considered as a most promising efficiency enhancement solution for the fourth Generation (4G) and beyond wireless communications.

Currently, Orthogonal Frequency Division Multiplexing (OFDM) is widely regarded as the key underlying air interface technology for wireless systems such as WiMAX, the third Generation Partnership Project (3GPP) Long Term Evolution (LTE) and 3GPP2 Ultra Mobile Broadband (UMB), Digital Video Broadcasting (DVB), and Wireless Local Area Network (WLAN). Due to the inherent digital modulation nature of these technologies, OFDM signals have high Peak-to Average Power Ratio (PAPR) that adversely impacts the efficiency of PAs used in wireless at both base stations and user equipment.

If it applies envelope tracking in OFDM system to enhance ET PA system performance, the challenges of the ET PA lies in that the performance which is good for 3G CDMA systems may exhibit poor performance when used in conjunction with OFDM signals, given the stringent Error Vector Magnitude (EVM) and spectral emission requirements specified in 3GPP standard because of high PAPR signal characteristics.

Besides, it is known that in the ET PA, the power supply voltage applied to the PA is constantly adjusted in accordance with the envelope version of an original input signal to ensure that the PA is operating at the peak efficiency over the output power range. However, when the PA power supply is changed from low to high instantaneously and dynamically or vice-versa, the PA operating condition on the drain-side would change dramatically accordingly. This significant change of the PA operating point would give rise to undesirable distortions and memory effects, which may cause gain collapse and unpredictable and non-correctable distortions and adversely affect both efficiency and linearity of an ET PA system.

SUMMARY

Embodiments of the subject matter described herein generally relate to envelope shaping in envelope tracking power amplification.

An embodiment provides a method of envelope shaping in envelope tracking power amplification. The method comprises: performing an envelope shaping operation on reference envelope signals in a time domain to obtain shaped envelope signals; performing a signal quality control on the shaped envelope signals in a frequency domain; and converting the shaped envelope signals from the frequency domain into the time domain to obtain resulting shaped envelope signals.

Another embodiment provides an apparatus for envelope shaping in envelope tracking power amplification. The apparatus comprises: at least one processor; and at least one memory storing computer program instructions, wherein the at least one memory and the computer program instructions are configured to, with the at least one processor, cause the apparatus at least to: perform an envelope shaping operation on reference envelope signals in a time domain to obtain shaped envelope signals; perform a signal quality control on the shaped envelope signals in a frequency domain; and convert the shaped envelope signals from the frequency domain into the time domain to obtain resulting shaped envelope signals.

Yet another embodiment provides an apparatus for envelope shaping in envelope tracking power amplification. The apparatus comprises: at least one processor; and at least one memory storing computer program instructions, wherein the at least one memory and the computer program instructions are configured to, with the at least one processor, cause the apparatus at least to: up convert baseband reference envelope signals in a frequency domain; convert the converted baseband reference envelope signals from the frequency domain to a time domain to obtain reference envelope signals; perform an envelope shaping operation on the reference envelope signals in the time domain to obtain shaped envelope signals; correct the shaped envelope signals with corrective signals if magnitudes of respective envelope error signals for the shaped envelope signals are higher than a predefined threshold; and convert the shaped envelope signals from the frequency domain into the time domain to obtain resulting shaped envelope signals.

In accordance with embodiments of the subject matter described herein, after envelope shaping in the time domain, a further signal quality control is performed on shaped envelope signals. Accordingly, the signal quality of the shaped envelope signal can be well controlled and thus a better signal quality can be achieved without any modifications to the receiver side. The PAPR of the envelope signal may in turn be reduced before entering into a supply modulator and the efficiency of the ET supply modulator could be improved since it is more likely to operate in a high efficiency region. Therefore, the system performance of the ET PA, particularly the system efficiency and the linearity, can be improved.

It is to be understood that this Summary is provided to introduce a selection of concepts in a simplified form. The concepts are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 3 schematically illustrates a flow chart of a method of envelope shaping in envelope tracking power amplification in accordance with embodiments of the subject matter described herein;

FIGS. 4A to 4F schematically illustrate example shaping transfer functions and shaping waveforms in accordance with embodiments of the subject matter described herein;

DETAILED DESCRIPTION

The subject matter described herein will now be discussed with reference to several example embodiments. It should be understood these embodiments are discussed only for the purpose of enabling those skilled persons in the art to better understand and thus implement the subject matter described herein, rather than suggesting any limitations on the scope of the subject matter.

As used herein, the term "includes" and its variants are to be read as open terms that mean "includes, but is not limited to." The term "or" is to be read as "and/or" unless the context clearly indicates otherwise. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Figure 1:
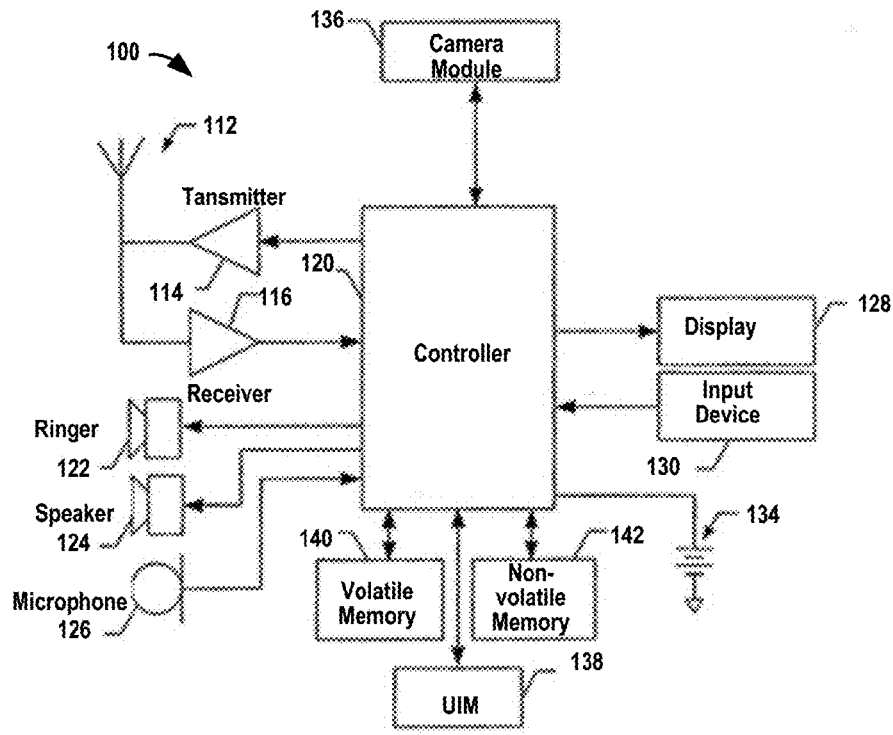
FIG. 1 schematically illustrates a block diagram of an electronic device in which embodiments of the subject matter described herein may be implemented.

FIG. 1 illustrates a block diagram of an electric device 100 in accordance with an embodiment of the subject matter described herein. The electronic device 100 may be a mobile device, such as a smart phone. However, it is to be understood that any other types of electronic devices with more than one cameras may also easily adopt embodiments of the subject matter described herein, such as a portable digital assistant (PDA), a pager, a mobile computer, a mobile TV, a game apparatus, a laptop, a tablet computer, a camera, a video camera, a GPS device, and other types of electronic devices with a transmitter.

The electronic device 100 comprises one or more antennas 112 operable to communicate with the transmitter 114 in which the subject matter as described therein can be implemented and the receiver 116. The electronic device 100 further comprises at least one controller 120. It should be understood that the controller 120 comprises circuits or logic required to implement the functions of the electronic device 100. For example, the controller 120 may comprise a digital signal processor, a microprocessor, an A/D converter, a D/A converter, and/or any other suitable circuits. The control and signal processing functions of the electronic device 100 are allocated in accordance with respective capabilities of these devices.

The electronic device 100 may further comprise a user interface, which, for example, may comprise a ringer 122, a speaker 124, a microphone 126, a display 128, and an input device 130 such as a keyboard and/or mouse, and all of the above devices are coupled to the controller 120. The electronic device 100 may further comprise a camera module 136 for capturing static and/or dynamic images.

The electronic device 100 may further comprise a battery 134, such as a vibrating battery set, for supplying power to various circuits required for operating the electronic device 100 and alternatively providing mechanical vibration as detectable output. In an embodiment, the electronic device 100 may further comprise a user identification module (UIM) 138. The UIM 138 is usually a memory device with a processor built in. The UIM 138 may for example comprise a subscriber identification module (SIM), a universal integrated circuit card (UICC), a universal user identification module (USIM), or a removable user identification module (R-UIM), etc. The UIM 138 may comprise a card connection detecting apparatus.

The electronic device 100 further comprises a memory. For example, the electronic device 100 may comprise a volatile memory 140, for example, comprising a volatile random access memory (RAM) in a cache area for temporarily storing data. The electronic device 100 may further comprise another non-volatile memory 142 which may be embedded and/or movable. The non-volatile memory 142 may additionally or alternatively include for example, EEPROM and flash memory, etc. The memory 140 may store any item in the plurality of information segments and data used by the electronic device 100 so as to implement the functions of the electronic device 110. For example, the memory may contain machine-executable instructions which, when executed, cause the controller 120 to implement the method described below.

It should be understood that the structural block diagram in FIG. 1 is shown only for illustration purpose, without suggesting any limitations on the scope of the subject matter described herein. In some cases, some devices may be added or reduced as required.

Embodiments of the subject matter can be described in the general context of computer-executable instructions, such as those included in program modules, being executed in a computing environment on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Computer-executable instructions for program modules may be executed within a local or distributed computing environment. In a distributed computing environment, program modules may be located in both local and remote computer storage media.

As mentioned hereinbefore, if the ET PA is used in conjunction with OFDM signals, the performance which is good for 3G CDAM systems may exhibit poor performance, given that the stringent RVM requirements as specified in 3GPP standard high PAPR signal characteristics. In view of this, there is proposed a new solution for envelope shaping in envelope tracking power amplification. Hereinbelow, reference will be made to FIGS. 2 to 8 to describe the solution as provided in the subject matter described herein in detail.

Figure 2:
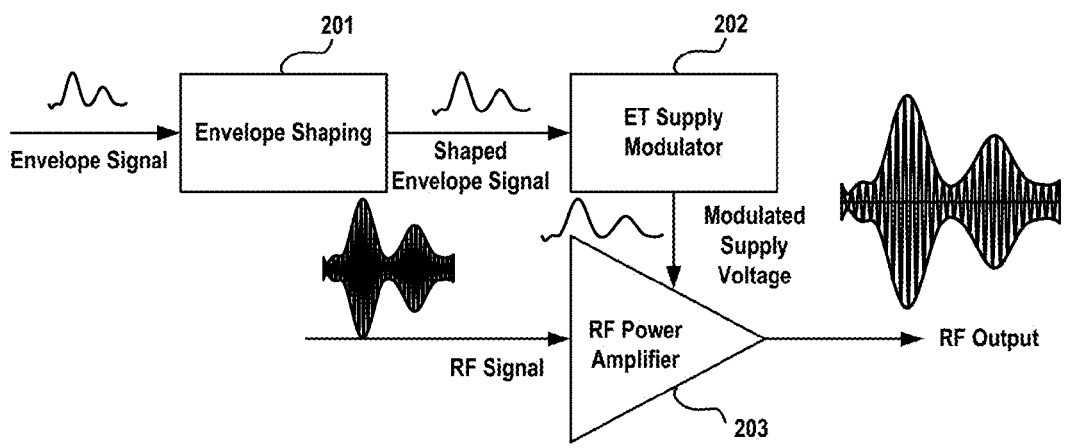
FIG. 2 schematically illustrates a block diagram of envelope tracking power amplifier system in which embodiments of the subject matter described herein are implemented.

FIG. 2 illustrates a block diagram of envelope tracking power amplifier system in which embodiments of the subject matter described herein are implemented, and particularly illustrates a block diagram exemplarily illustrating a number of functional blocks for envelope tracking power amplification in accordance with an embodiment of the subject matter described herein.

As illustrated in FIG. 2, an envelope shaping module 201 may receive an envelope signal resulted from a baseband signal or a digital Intermediate Frequency ("IF") signal, and shape the envelope signal for example, in accordance with example embodiments of the subject matter described herein, as will be discussed in detail later. Then, the resulted shaped envelope signal may be fed into an ET supply modulator 202, which may then modulate the power supply voltage based on the shaped envelope signal and feed the modulated supply voltage to an RF power amplifier 203 as a power supply. Then, the RF power amplifier 203 may amplify the RF signal using the modulated power supply. During the amplification processing, due to the use of example embodiments described herein, the PAPR of the envelope signal may be reduced before entering into the ET supply modulator 202 and the efficiency of the ET supply modulator 202 could be improved since it is more likely to operate in a high efficiency region.

FIG. 3 illustrates a flowchart 300 of a method of envelope shaping in envelope tracking power amplification in accordance with an embodiment of the subject matter described herein.

As illustrated in flowchart 300, first at step 310, an envelope shaping operation on reference envelope signals is performed in a time domain to obtain shaped envelope signals. As just mentioned, the reference envelope signal may be resulted from a baseband signal or a digital IF signal but for the OFDM system, it is advantageous to use the baseband signal as the reference envelope signal. The envelope shaping operation per se may include an envelope amplitude calculation and a shaping function execution. The envelope amplitude calculation means calculation of the amplitude of the reference envelope signal, which will be performed on each of the reference envelope signals. As an example, the envelope amplitude calculation can be performed based on the following equation:

$$\text{EnvelopeAmplitude} = \sqrt{I^2 + Q^2} \quad (\text{Eq. 1})$$

wherein I and Q represent I-Q data of the reference envelope signal respectively. In such a way, the envelope amplitude of the envelope signal may be obtained.

Then, an envelope shaping function may be used to shape, particularly "de-trough" the envelope of the time domain signal within specified bounds. Constraints may be achieved by applying a predetermined threshold to shape the troughs which are below a threshold value. That is to say, the troughs of the envelope signal below the threshold value will be clipped to the threshold value and the same time original phase of the envelope signal will be maintained. The threshold value may be determined based on, for example, the knee voltage of RF PA. For example, the threshold value should be equal to or higher than the knee voltage of RF PA. If a reference signal, which can also be called as a sample herein, runs below the threshold value, the magnitude of the samples is shaped to be equal to or greater than the threshold value while keeping the original sample phase.

Herein, various envelope shaping functions can be employed to minimize spectral emissions. The example envelope shaping functions include but are not limited to linear or non-linear de-trough shaping functions, such as offset shaping, hard de-trough shaping, soft de-trough shaping or any other suitable envelope shaping functions such as Nujira N6 and Wilson shaping function. For a purpose of illustration, offset shaping, hard de-trough shaping, soft de-trough shaping are illustrated in FIGS. 4A to 4F.

FIGS. 4A and 4B illustrate a linear offset shaping function and corresponding offset shaping waveform. From FIGS. 4A and 4B, it is clear that the offset transfer shaping function defines an optimum offset voltage to the original envelope signal for linearity, but this does not change the envelope bandwidth because it is a linear scaling operation to reduce the PAPR of envelope. When the knee voltage $V_{knee}$ is constant over the entire operating range, the offset voltage is preferred to be equal to the knee voltage. Otherwise, the highest knee voltage across operating range can be used as the offset value to cover all scenarios to guarantee removing the supply voltage swing into the knee region. The shaped envelope of the drain/collector voltage can be expressed as $$V_{env\_shaped}(t) = ((V_{sm\_max} - V_{knee})/V_{env\_max}) \cdot V_{env}(t)$$
$$V_{knee} = k \cdot V_{env}(t) + V_{knee} \quad (\text{Eq. 2})$$

where $V_{env\_shaped}(t)$ is the shaped envelope signal, $V_{sm\_max}$ denotes the maximum supply voltage for the PA; $V_{knee}$ denotes the knee voltage of the PA; $V_{env\_max}$ is the maximum voltage of the input reference envelope signal; $V_{env}(t)$ is the input reference envelope signal; and k is the slope of linear offset shaping function.

Figure 4C:
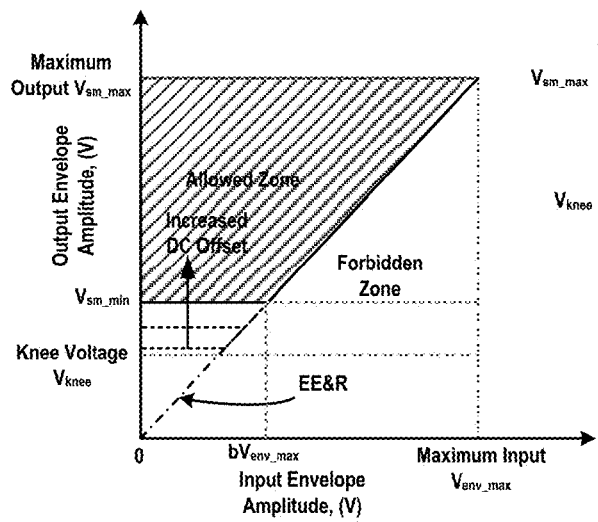
Figure 4D:
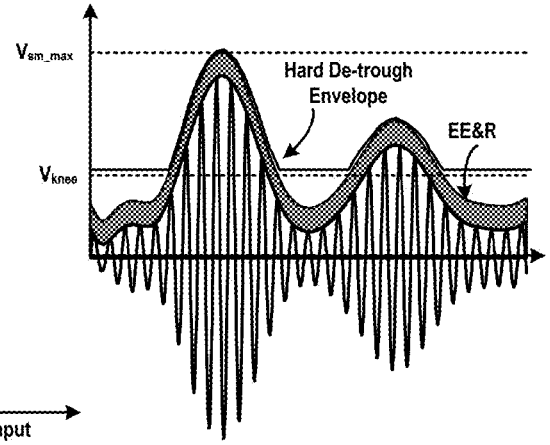

FIGS. 4C and 4D illustrate a hard de-trough shaping function and a corresponding hard de-trough waveform. From FIGS. 4C and 4D, it is clear that the hard de-trough shaping function has two different slopes with a constant offset voltage, which is called hard de-trough. The constant offset voltage at a low input voltage range is adjusted to be greater than the knee voltage of PA. By operating above the knee region, the nonlinear gain and phase distortion in PA can be avoided. To achieve a high efficiency, both PAs for the Envelope Elimination and Restoration (EE&R) and ET techniques have been operated at a saturated state along the supply modulation signal. The hard de-trough transfer function can be expressed as $$V_{env\_shaped}(t) = \begin{cases} V_{sm\_min} & 0 \le V_{env}(t) \le b \cdot V_{env\_max} \\ (V_{sm\_max}/V_{env\_max}) \cdot V_{env}(t), & V_{env}(t) > b \cdot V_{env\_max} \end{cases} \quad (\text{Eq. 3})$$

wherein $V_{env\_shaped}(t)$ is the shaped supply voltage for the PA; $V_{env}(t)$ is the input reference envelope signal with maximum magnitude $V_{env\_max}$; $V_{sm\_max}$ and $V_{sm\_min}$ are the maximum and minimum supply voltage for the PA respectively; and b is the de-trough factor, given by $b = V_{sm\_min}/V_{sm\_max} \ge V_{knee}/V_{sm\_max}$.

However, the degree of de-trough in voltage is typically found experimentally. The hard de-trough shaping process allows that the peak voltage region tracking the PA output envelope as close as possible, but stop tracking at a predetermined low voltage region, above knee voltage. It is reasonable because when the PA output power is small, modulating the supply does adversely affect too much in efficiency so that a constant DC offset voltage is applied as shown in FIGS. 4C and 4D. In this case, with a lower DC offset voltage approaching to knee voltage, better overall efficiency can be achieved because the envelope of RF output signal can be instantaneously and close tracked, reducing the wasted power from system level. The hard de-trough shaping function clips envelope with sharp corner with transition point to avoid voltages lower than the knee voltage. This abrupt curve expands the bandwidth of the envelope signal and impact amplitude modulation to amplitude modulation (AM-AM) characteristic of the PA.

Figure 4E:
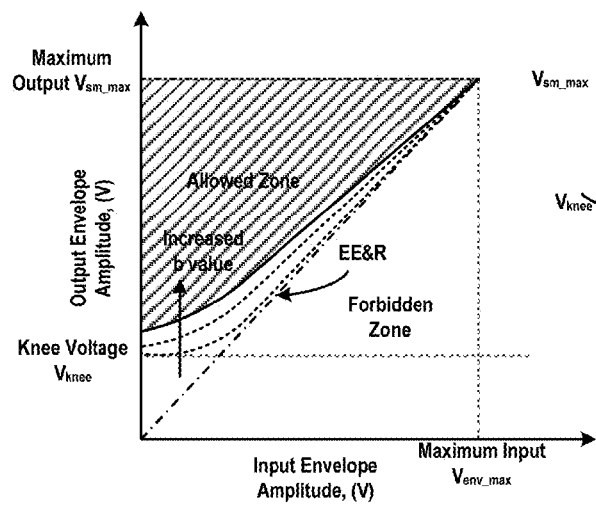
Figure 4F:
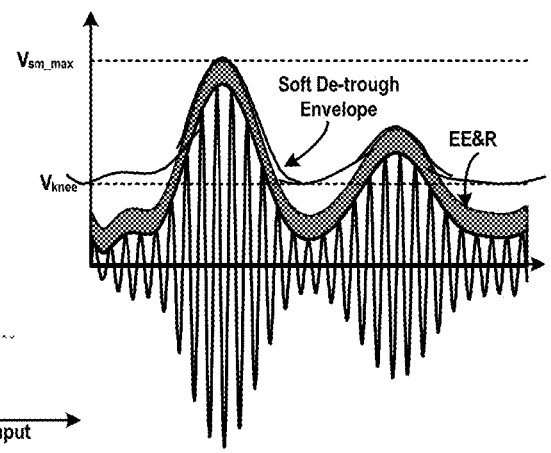

In contrast, there is a much smoother way to shape the low voltage region with envelope waveforms scaled instead of hard clipping, which is illustrated in FIGS. 4E and 4F. FIGS. 4E and 4F illustrate a soft de-trough shaping function and a corresponding soft de-trough shaping waveform. This kind of de-trough is called as soft de-trough, since the voltage level of the de-trough should be tunable for optimization for various PA conditions. A typical soft de-trough equation as given below is used to shape envelope to prevent gain collapse and phase distortions under knee voltage region.

$$V_{env\_shaped}(t) = V_{sm\_max} \cdot (V_{env}(t)/V_{env\_max} + b \cdot e^{-(V_{env}(t)/V_{env\_max})/b}) \quad \text{(Eq. 4)}$$

wherein $V_{env\_shaped}(t)$ is the shaped supply voltage for the PA; $V_{env}(t)$ is the input reference envelope signal with maximum magnitude $V_{env\_max}$; $V_{sm\_max}$ is the maximum supply voltage for the PA; and b is the de-trough factor, which is same as the definition in the hard de-trough function.

On the other hand, other advanced envelope shaping design can either be used, which may be expressed in more complex formulas, such as Nujira Wilson shaping and Nujira N=6 shaping, or simply use point-by-point shaping look-up-table (LUT) via experiments empirically. However, all of de-trough shaping are in the region between the linear de-trough shaping and the EE&R shaping, which may be expressed by:

$$V_{env\_shaped}(t) = V_{sm\_min} \cdot (\pi/\pi-2)) \cdot [1-(2/\pi) \cdot \cos(V_{env}(t) \cdot ((\pi-2)/2 \cdot V_{sm\_min})))]$$

$$V_{env\_shaped}(t) = (V_{sm\_min}^6 + V_{env}^6(t))^{1/6} \quad \text{(Eq. 5)}$$

wherein $V_{sm\_min}$ is the minimum supply voltage for the PA, which should be equal or greater than knee voltage; $V_{env}(t)$ is the input reference envelope signal. It is to understand that different shaping functions can provide different trade-offs between gain and average efficiency and in practice, the shaping functions can be selected based application requirements.

By means of the above-mentioned feasible envelope shaping functions, the reference envelope signals may be shaped and thus shaped envelope signals will obtained.

Then at step 320, a signal quality control can be further performed on the shaped envelope signals in a frequency domain.

After obtaining the shaped envelope signals, they will be converted from the time domain back to the frequency domain by means of a domain conversion such as a fast Fourier transform (FFT) so as to perform signal quality control in the frequency domain.

It can be understood that, the envelope shaping operation itself might introduce distortions in both in-band for modulation quality degradation and out-of-band spectral component increasing, finally resulting in deteriorating EVM and spectral emissions respectively. To address those issues, the present invention arranges additional signal quality control scheme to process and/or correct distorted envelopes of the in-band signal and restrict the out-of-band spectral energy separately. To perform this kind of processing, the time-domain representation is converted back into the frequency domain using the FFT mentioned above and with each sample being analyzed.

Particularly, for each sample of the shaped envelope signals, it may be first determined whether the shaped envelope signal belongs to an in-band signal or an out-of-band signal so that they can be treated accordingly. If a sample is associated with a constellation symbol, it will be classified as an in-band signal; otherwise, the sample will be classified as an out-of-band signal.

For the in-band signal, an in-band signal quality control can be performed for example based on a baseband reference envelope signal in a frequency domain and a modulation quality constraint. The baseband reference envelope signal is a reference envelope signal from the baseband and its time domain representation will be used as the reference envelope signal in envelope shaping. The modulation quality constraint may be for example an EVM constraint. For an in-band signal, it will be compared with the base band reference signal, and then the in-band signals of the shaped envelope signal may be corrected based on the comparison and the modulation quality constraint. For example, it is checked whether the difference between the shaped envelope signal and the baseband reference envelope signal is beyond a predetermined threshold that is dependent on the EVM constraint, then if the difference is too large to meet the EVM constraint, a correction will be performed so that the corrected envelope signal meet the EVM constraint; otherwise, it means that the shaped envelope signal is qualified and thus the shaped envelope signal will be output from the in-band control process. The purpose of the in-band control process is to ensure that the overall EVM does not exceed a predetermined limit and thus if the input shaped envelope signal already meet the EVM constrain, there is no need to make any correction.

On the other hands, if the sample is classified as an out-of-band signal, an out-of-band signal quality control will be performed on the shaped envelope signal, for example, based on a predetermined spectral mask requirement. The predetermined spectral mask requirement may be that as specified in 3GPP specification. In such a case, the magnitudes of out-of-band signal will be limited within a spectral mask, which may be a spectral mask determined based on the predetermined spectral mask requirement.

Besides, in order to improve the feasibility in term of the hardware resources and latency in practical implementation, another solution with reduced complexity variant and minimal resources is further proposed herein. Thus, it may consider performing only one of the in-band control and the out-of-band control according to specific application requirements. In addition, it is noticed that due to the statistical distribution of error introduced by envelope shaping operation, the changing of trough clipping ratio has little impact on computation complexity. Thus, in the subject matter described herein, a simplified version of signal quality control is proposed. Particularly, an envelope error magnitude for the shaped envelope signal will be compared with a predefined threshold, and then, based on the comparison, a correction will be performed on a shaped envelope signal with a corrective signal. If the magnitude of the envelope error signal for a shaped envelope signal is fallen within the specified threshold (for example an EVM threshold), the shaped envelope signal will be just output as it is. Otherwise, a small corrective signal will be added to the shaped envelope signal to decrease EVM into that as required in the 3GPP specification. The corrective signal can be obtained in any suitable ways; however, for a purpose of illustration, an example manner will be described. For example, the corrective signal may have a magnitude which is equal to the predetermined threshold multiplied by a specified maximum constellation magnitude and a phase of the envelope error signal.

After the signal quality control, at step 330, the frequency domain representation of the corrected shaped envelope signal will be converted back into the time domain by means of an Inverse Fast Fourier Transform (IFFT) so as to obtain the resulting shaped envelope signals, which will be fed to the ET supply modulator.

It should be noticed that, the method can be used in any communication system or communication device in which the ET PA shows an unsatisfied performance or a much better performance is required. Particularly, the envelope shaping method may be used in the OFDM system and the OFDM system may benefit therefrom. In such a case, the reference envelope signal may be resulted from baseband reference envelope signals in the frequency domain, i.e., baseband OFDM signals which may have a length of N carriers. The baseband reference envelope signals may be first converted to the time domain so that the reference envelope signal can be shaped in the time domain. The conversion can be performed through an inverse fast Fourier transform (IFFT) of length L times carrier number N to produce representation of the OFDM symbol in time domain.

Moreover, before the conversion, the baseband envelope signal may optionally be first processed through a Digital Up Converter (DUC) via frequency domain interpolation, particularly zero-padding. Through the up-conversion, the low-rate baseband envelope signal will be changed to a higher rate. In embodiments of the subject matter as described herein, the DUC can be placed at any places before the supply modulator, but it may be advantageous to arrange it before the envelope shaping because of spectrum spreading for out-of-band signals and preventions of spectral re-growth with following digital signal processing (DSP) blocks.

Optionally, the envelope shaping may be performed at a higher sampling frequency than a sampling frequency at which baseband signals are processed, in order to cover the trough regrowth effect caused by the DUC filtering process. The higher sampling frequency may be a multiple of the sampling frequency at which baseband signals are processed, for example 2 times, 4 times or any other times than the sampling frequency, and so on. The higher sampling frequency may spread the non-linear distortions over wider bandwidth, which is introduced by the subsequent processes.

In accordance with embodiments of the subject matter described herein, after envelope shaping in the time domain, a further signal quality control is performed on shaped envelope signals. Accordingly, the signal quality of the shaped envelope signal can be well controlled and thus a better signal quality can be achieved without any modifications to the receiver side. The PAPR of the envelope signal may in turn be reduced before entering into a supply modulator and the efficiency of the ET supply modulator could be improved since it is more likely to operate in a high efficiency region. Therefore, the system performance of the ET PA, particularly the system efficiency and the linearity, can be improved.

Hereinafter, only for a purpose of illustration, a specific implementation of a method of envelope shaping in envelope tracking power amplification in accordance with embodiments of the subject matter described herein will be described in detail with reference to FIG. 5.

Figure 5:
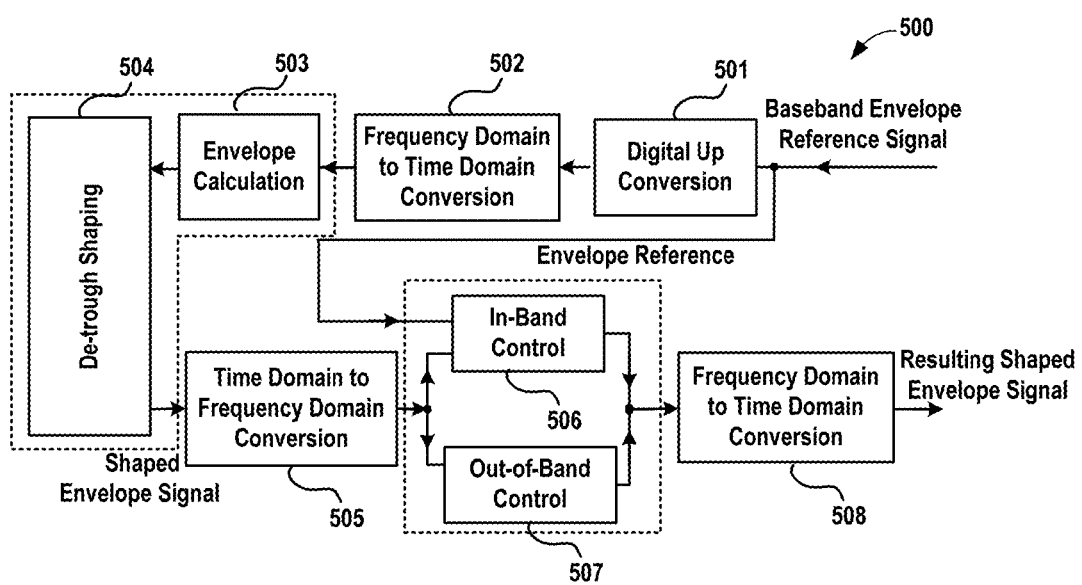
FIG. 5 schematically illustrates a specific implementation of a method of envelope shaping in envelope tracking power amplification in accordance with embodiments of the subject matter described herein.

As illustrated in FIG. 5, at the input, OFDM symbols from the baseband is received in the frequency domain as the baseband reference envelope signals. The OFDM symbols may have a length of N carriers. Then in block 501, the baseband reference envelope signals are up converted by a DUC so as to convert the reference envelope signals from a low rate to a higher rate. Then at block 502, the reference envelope signals at the higher rate are converted from the frequency domain into the time domain through the frequency domain to time domain conversion, for example IFFT. Afterwards, in block 503, the envelope calculation is performed; particularly, the amplitudes of envelope signal time domain representations are calculated based on the equation as given in Eq. 1. Then in block 504, an envelope shaping function is used to shape the envelope signal in the time domain, particular, de-trough the envelope signal within the specified bounds. Various envelope shaping functions can be used in embodiments of the subject matter as described herein, such as those illustrated in FIGS. 4A to 4F. This could be achieved by applying a threshold to shape the troughs of envelope signal time domain representations which are below the threshold value. The threshold may be a value equal to or higher than the knee voltage of RF PA. When an envelope signal is below the threshold value, the magnitude thereof will be shaped to be equal or greater than the threshold value. After the envelope shaping, the shaped envelope signals are converted from the time domain to the frequency domain in block 505 to obtain the envelope signal representations in the frequency domain. Then the envelope signals may be classified into in-band signals and out-of-band signals. For the in-band signals, an in-band control is performed in block 506 so as to correct the distorted envelopes of the in-band signals so that the EVM does not exceed the predetermined limit; while for the out-of-band signals, the magnitude will be constrained to a spectral mask in block 507 so as to meet the spectral mask requirement. After the in-band control and the out-of-band control, the in-band signals and the out-of-band signals are combined together. Then, in block 508, the combined signal is converted from the frequency domain into the time domain again by means of IFFT so as to obtain the resulting shaped reference signals.

Figure 6:
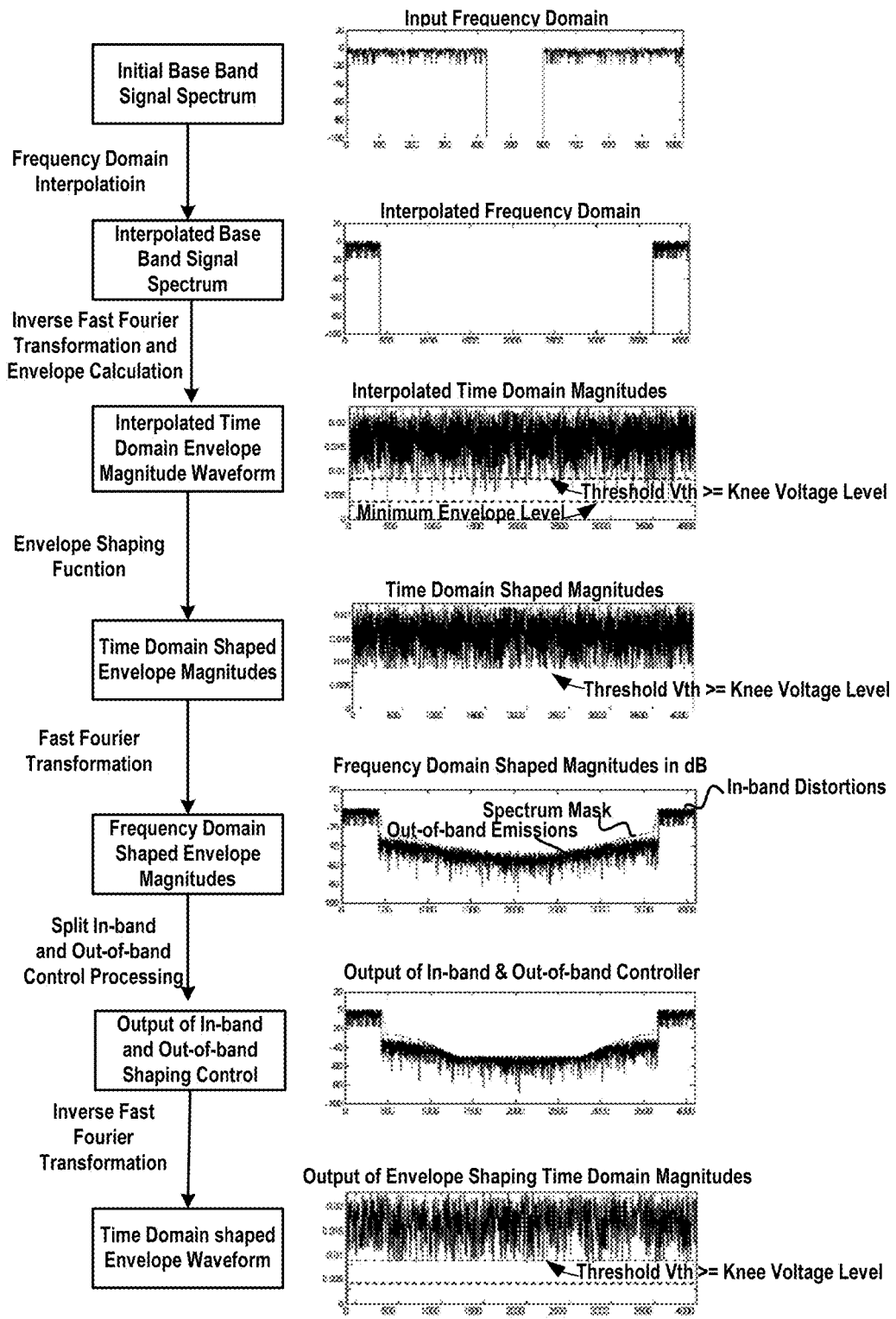
FIG. 6 schematically illustrates a signal flow of the envelope signal in accordance with embodiments of the subject matter described herein.

For a purpose of illustration, signal waveforms at different stages are illustrated in FIG. 6. As illustrated, the initial baseband signal spectrum, i.e., the spectrum of the input envelope signal, is illustrated in the first waveform diagram. After the digital up conversion, particularly the frequency domain interpolation, it may obtain the interpolated baseband signal spectrum as illustrated in the second waveform diagram and it is clear that the out-of-band signals are spread over a wider frequency band. Then the interpolated baseband signal is converted from the frequency domain to the time domain and the converted time domain envelope magnitude waveform is illustrated in the third waveform diagram. From the third waveform curve diagram, it is clear that many signals have troughs lower than the threshold Vth which is equal to or higher than the knee voltage level, and the minimum envelope level of the envelope signals is far below than the threshold Vth. After the envelope shaping, the time domain shaped envelope signals are illustrated in the fourth waveform diagram, in which all the envelope signals have troughs higher than the threshold Vth. Next, the shaped envelope signals are converted from the time domain to the frequency domain to do the signal quality control. After the FFT, the frequency domain shaped envelope magnitudes are illustrated in the fifth waveform diagram, from which it is clear that there are both in-band distortions and out-of band emission. After the in-band and out-of-band control, the obtained envelope magnitudes are illustrated in the sixth waveform diagram. It is clear that the in-band distortions are substantially corrected and all the out-of band signals are kept under the spectrum mask. Finally, IFFT is performed and the envelope signals are converted back to the time domain again. In such a way, the adverse effect caused by the envelope shaping may be reduced and thus it may achieve a better system performance for the ET PA.

Figure 7:
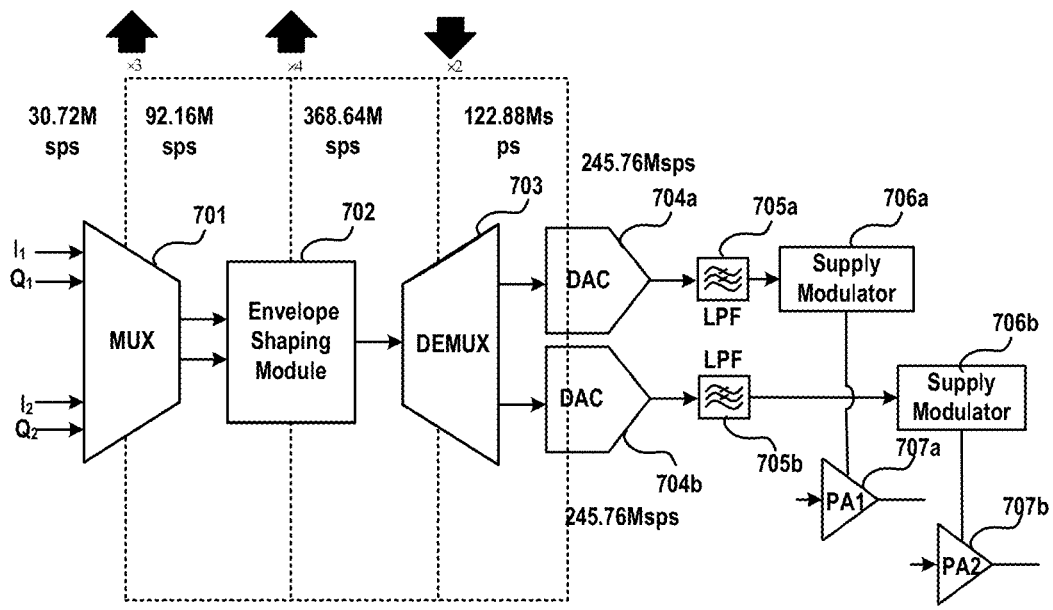
FIG. 7 schematically illustrates an exemplary implementation for a 2×2 MIMO LTE 20 MHz transmitter.

FIG. 7 illustrates an exemplary implementation for a 2×2 MIMO LTE 20 MHz transmitter. As illustrated, two sets of reference envelope signals I1, Q1, I2, Q2 are input into a multiplex MUX 701, the multiplexer MUX 701 outputs the multiplexed reference envelope signals into the envelope shaping module 702 in which the envelope shaping is performed on the input multiplexed reference envelope signals according an embodiment of the subject matter as described therein, such as methods 300 and 500 described above. Then the shaped signals will be input into a de-multiplexer DEMUX 703, the DEMUX 703 de-multiplexes the shaped envelope signals and send the de-multiplexed shaped signals to DACs 704a and 704b respectively, which will convert respective shaped envelope signals from the digital signals to analogue signals. The converted analogue envelope signals then are filtered by low pass filters (LPFs) 705a and 705b respectively to remove the harmonics and next fed into the supply modulators 706a and 706b, which modulate the power supply voltage based on the shaped envelope signals respectively and respectively provide the modulated supply voltages to PA1 and PA2 707a and 707b as power supplies. Then, PA1 and PA2 707a and 707b will amplify the input signal respectively using the modulated power supplies from the supply modulators 706a and 706b. For other MIMO systems, the embodiments of the subject matter as described herein can be applied in similar way.

In addition, in the subject matter as described herein, there is also provided an apparatus for envelope shaping in envelope tracking power amplification. Hereinafter, the apparatus will be described with reference to FIG. 8, which illustrates a simplified schematic block diagram illustrating an example apparatus 800 according to the subject matter as described therein.

Figure 8:
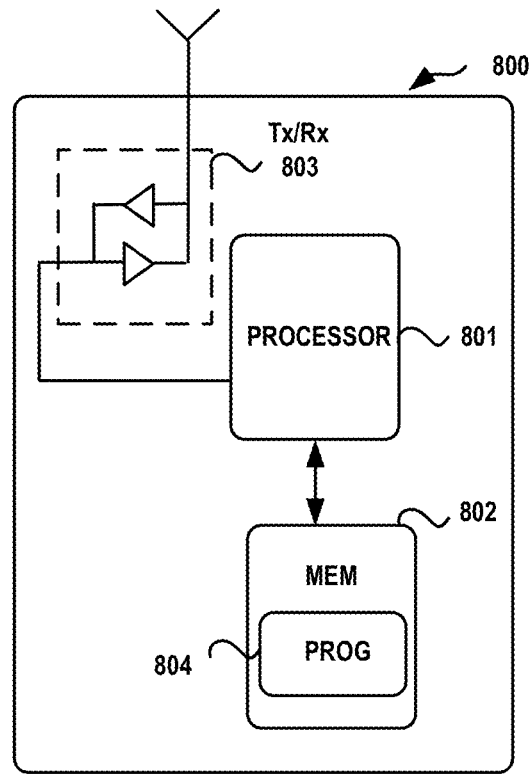
FIG. 8 schematically illustrates a block diagram of an apparatus of envelope shaping in envelope tracking power amplification in accordance with embodiments of the subject matter described herein.

As illustrated in FIG. 8, the apparatus 800 includes at least one processor 801, such as a data processor, at least one memory (MEM) 802 coupled to the processor 801, and a suitable RF transmitter and receiver TX/RX 803 coupled to the processor 801. The MEM 802 stores a program (PROG) 804. The TX/RX 803 is for bidirectional wireless communications.

The PROG 804 is assumed to include instructions that, when executed by the processor 801, enable the apparatus 800 to operate in accordance with the exemplary embodiments of the present disclosure, as discussed herein with the method 300, 500. For example, the apparatus 800 may be embodied as a terminal device or a part thereof when the example embodiments of the subject matter as described herein are carried out in the terminal device, such as a mobile station.

In general, embodiments of the subject matter as described herein may be implemented by computer software executable by at least one processor 801 of the apparatus 800, or by hardware, or by a combination of software and hardware.

The MEM 802 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the apparatus 800, there may be several physically distinct memory units in the apparatus 800. The processor 901 may be of any type suitable to the local technical environment, and may include one or more of general purpose computers, special purpose computers, microprocessors, digital signal processors (DSPs) and processors based on multicore processor architecture, as non-limiting examples. The apparatus 800 may have multiple processors, such as for example an application specific integrated circuit chip that is slaved in time to a clock which synchronizes the main processor.

In one aspect of the subject matter as described herein, the apparatus 800 may comprise at least one processor and at least one memory including computer program instructions, wherein the at least one memory and computer program instructions are configured to, with the at least one processor, cause the apparatus 800 at least to perform an envelope shaping operation on reference envelope signals in a time domain to obtain shaped envelope signals; perform a signal quality control on the shaped envelope signals in a frequency domain; and convert the shaped envelope signals from the frequency domain into the time domain to obtain resulting shaped envelope signals.

In an embodiment, the performing the signal quality control may comprise performing an in-band signal quality control on the shaped envelope signals based on baseband reference envelope signals in the frequency domain and a modulation quality constraint.

In another embodiment, the performing the in-band signal quality control may comprise comparing in-band signals of the shaped envelope signals and the baseband reference envelope signals; correcting the in-band signals of the shaped envelope signals based on the comparison and the modulation quality constraint.

In a further embodiment, the performing the signal quality control may comprise performing an out-of-band signal quality control on the shaped envelope signals based on a predetermined spectral mask requirement.

In a still further embodiment, the performing the out-of-band signal quality control may comprise limiting magnitudes of out-of-band signals of the shaped envelope signals within a spectral mask based on the predetermined spectral mask requirement.

In a yet further embodiment, the performing the signal quality control may comprise correcting a shaped envelope signal with a corrective signal based on comparison between a magnitude of an envelope error signal for the shaped envelope signal and a predefined threshold.

In another embodiment, the corrective signal may have a magnitude of the predetermined threshold multiplied by a specified maximum constellation magnitude and a phase of the envelope error signal.

In a further embodiment, the apparatus may be further configured to: up convert, before performing the envelope shaping operation, a baseband reference envelope signal in the frequency domain; convert the converted baseband reference envelope signal from the frequency domain to the time domain to obtain the reference envelope signal. In such a case, the envelope shaping operation may be optionally performed at a sampling frequency higher than a sampling frequency at which baseband signals are processed.

In addition, in the subject matter described herein, there is also provided a computer storage medium having computer-executable instructions, which when executed perform actions in accordance with the method as described hereinbefore with reference to FIGS. 2 to 7. For a purpose of simplification, these actions will be not be elaborated herein, for details about these actions, reference may be made to the description with reference to FIGS. 2 to 7.

Hereinbefore, specific embodiments of the subject matter have been described; however, it should be appreciated that all of these embodiments are presented only for illustration purpose and the subject matter are not limited thereto. In fact, from the teachings provided herein, the skilled in the art will conceive various modifications or variations without departing the spirit of the subject matter described herein. For example, in embodiments of the subject matter as described herein, OFDM system is mainly referred to described the solution as provided therein, however, it is to understand that it is also possible to apply the subject matter as described herein to other communication system (such as CDMA system) than the OFDM system to improve the performance of ET PA. Actually, the subject matter as described herein can be used in any communication systems or devices in which ET PA is implemented, such as a base station, user equipment, etc. Moreover, in embodiments of the subject matter as described herein, particular equations are illustrated and in fact, these equations may be modified in different applications. It should be appreciated that all these modifications or variations should be included within the scope of the subject matter described herein and the scope of the subject matter described herein is only defined by the claims appended hereinafter.

Generally, various embodiments of the subject matter described herein may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the subject matter described herein are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the subject matter can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the subject matter described herein may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of this disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the subject matter described herein, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. A method of envelope shaping in envelope tracking power amplification, comprising:
    performing an envelope shaping operation on reference envelope signals in a time domain to obtain shaped envelope signals;
    performing a signal quality control on the shaped envelope signals in a frequency domain to obtain a quality controlled shaped envelope signals;
    converting the quality controlled shaped envelope signals from the frequency domain into the time domain to obtain resulting shaped envelope signals;
    outputting the resulting shaped envelope signals to at least an envelope tracking supply modulator; and
    at least one of:
        performing the signal quality control comprising correcting the shaped envelope signal with a corrective signal, the corrective signal having a magnitude of a predetermined threshold multiplied by a specified maximum constellation magnitude and a phase of an envelope error signal; or
        up converting, before performing the envelope shaping operation, baseband reference envelope signals in the frequency domain and converting the up converted baseband reference envelope signals from the frequency domain to the time domain to obtain the reference envelope signals.

2. The method of claim 1, wherein the performing the signal quality control comprises:
    performing an in-band signal quality control on the shaped envelope signals based on baseband reference envelope signals in the frequency domain and a modulation quality constraint.

3. The method of claim 2, wherein the performing the in-band signal quality control comprises:
    comparing in-band signals of the shaped envelope signals and the baseband reference envelope signals;

correcting the in-band signals of the shaped envelope signals based on the comparison and the modulation quality constraint.

4. The method of claim 1, wherein the performing the signal quality control comprises:
performing an out-of-band signal quality control on the shaped envelope signals based on a predetermined spectral mask requirement.

5. The method of claim 4, wherein the performing the out-of-band signal quality control comprises:
limiting magnitudes of out-of-band signals of the shaped envelope signals within a spectral mask based on the predetermined spectral mask requirement.

6. The method of claim 1, wherein the performing the signal quality control comprises:
correcting a shaped envelope signal with a corrective signal based on a comparison between a magnitude of an envelope error signal for the shaped envelope signal and a predefined threshold.

7. The method of claim 6, wherein the corrective signal has a magnitude of the predetermined threshold multiplied by a specified maximum constellation magnitude and a phase of the envelope error signal.

8. The method of claim 1, comprising:
up converting, before performing the envelope shaping operation, baseband reference envelope signals in the frequency domain;
converting the converted baseband reference envelope signals from the frequency domain to the time domain to obtain the reference envelope signals.

9. The method of claim 8, wherein the envelope shaping operation is performed at a sampling frequency higher than a sampling frequency at which baseband signals are processed.

10. An apparatus for envelope shaping in envelope tracking power amplification, comprising:
at least one processor; and
at least one memory storing computer program instructions,
wherein the at least one memory and the computer program instructions are configured to, with the at least one processor, cause the apparatus at least to:
perform an envelope shaping operation on reference envelope signals in a time domain to obtain shaped envelope signals;
perform a signal quality control on the shaped envelope signals in a frequency domain to obtain quality controlled shaped envelope signals;
convert the quality controlled shaped envelope signals from the frequency domain into the time domain to obtain resulting shaped envelope signals;
outputting the resulting shaped envelope signals to at least an envelope tracking supply modulator; and
at least one of:
performing the signal quality control comprising correcting the shaped envelope signal with a corrective signal, the corrective signal having a magnitude of a predetermined threshold multiplied by a specified maximum constellation magnitude and a phase of an envelope error signal; or
up converting, before performing the envelope shaping operation, baseband reference envelope signals in the frequency domain and converting the up converted baseband reference envelope signals from the frequency domain to the time domain to obtain the reference envelope signals.

11. The apparatus of claim 10, wherein the performing the signal quality control comprises:
performing an in-band signal quality control on the shaped envelope signals based on baseband reference envelope signals in the frequency domain and a modulation quality constraint.

12. The apparatus of claim 11, wherein the performing the in-band signal quality control comprises
comparing in-band signals of the shaped envelope signals and the baseband reference envelope signals;
correcting the in-band signals of the shaped envelope signals based on the comparison and the modulation quality constraint.

13. The apparatus of claim 10, wherein the performing the signal quality control comprises:
performing an out-of-band signal quality control on the shaped envelope signals based on a predetermined spectral mask requirement.

14. The apparatus of claim 13, wherein the performing the out-of-band signal quality control comprising:
limiting magnitudes of out-of-band signals of the shaped envelope signals within a spectral mask based on the predetermined spectral mask requirement.

15. The apparatus of claim 10, wherein the performing the signal quality control comprises
correcting a shaped envelope signal with a corrective signal based on comparison between a magnitude of an envelope error signal for the shaped envelope signal and a predefined threshold.

16. The apparatus of claim 15, wherein the corrective signal has a magnitude of the predetermined threshold multiplied by a specified maximum constellation magnitude and a phase of the envelope error signal.

17. The apparatus of claim 10, wherein the apparatus is further configured to:
up convert, before performing the envelope shaping operation, baseband reference envelope signals in the frequency domain;
convert the converted baseband reference envelope signals from the frequency domain to the time domain to obtain the reference envelope signals.

18. The apparatus of claim 17, wherein the envelope shaping operation is performed at a sampling frequency higher than a sampling frequency at which baseband signals are processed.

19. An apparatus for envelope shaping in envelope tracking power amplification, comprising:
at least one processor; and
at least one memory storing computer program instructions,
wherein the at least one memory and the computer program instructions are configured to, with the at least one processor, cause the apparatus at least to:
up convert baseband reference envelope signals in a frequency domain;
convert the converted baseband reference envelope signals from the frequency domain to a time domain to obtain reference envelope signals;
perform an envelope shaping operation on the reference envelope signals in the time domain to obtain shaped envelope signals;
correct the shaped envelope signals with corrective signals if magnitudes of respective envelope error signals for the shaped envelope signals are higher than a predefined threshold to obtain corrected shaped envelope signals;
convert the corrected shaped envelope signals from the frequency domain into the time domain to obtain resulting shaped envelope signals; and output the resulting shaped envelope signals to at least an envelope tracking supply modulator.

20. The apparatus of claim 19, wherein the corrective signals have respectively magnitudes of the predetermined threshold multiplied by a specified maximum constellation magnitude and phases of the respective envelope error signals, and wherein the envelope shaping operation is performed at a sampling frequency higher than a sampling frequency at which baseband signals are processed.

* * * * *